(12) United States Patent
Mellody et al.

(10) Patent No.: US 7,364,943 B2
(45) Date of Patent: Apr. 29, 2008

(54) METHOD OF BONDING A MICROELECTRONIC DIE TO A SUBSTRATE AND ARRANGEMENT TO CARRY OUT METHOD

(75) Inventors: James P. Mellody, Phoenix, AZ (US); Sabina J. Houle, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 376 days.

(21) Appl. No.: 11/133,009

(22) Filed: May 18, 2005

(65) Prior Publication Data
US 2006/0263935 A1    Nov. 23, 2006

(51) Int. Cl.
| | |
|---|---|
| H01L 21/50 | (2006.01) |
| H01L 21/48 | (2006.01) |
| H01L 21/44 | (2006.01) |
| H01L 23/485 | (2006.01) |
| H01L 23/488 | (2006.01) |
| H01L 23/52 | (2006.01) |
| H01L 23/48 | (2006.01) |

(52) U.S. Cl. ............... 438/108; 438/106; 438/612; 257/778; 257/780; 257/738; 257/E23.021; 257/E23.023; 257/779

(58) Field of Classification Search .......... 438/108, 438/106, 612; 257/778–780, 738, E23.021, 257/E23.023
See application file for complete search history.

(56) References Cited

U.S. PATENT DOCUMENTS

| | | | | |
|---|---|---|---|---|
| 5,704,116 | A * | 1/1998 | Gamota et al. | 29/840 |
| 6,475,828 | B1 * | 11/2002 | Hoang | 438/108 |
| 6,610,559 | B2 * | 8/2003 | Wang et al. | 438/108 |
| 6,724,091 | B1 * | 4/2004 | Jayaraman et al. | 257/778 |
| 6,803,639 | B2 * | 10/2004 | Ono et al. | 257/433 |
| 6,861,278 | B2 * | 3/2005 | Quinones et al. | 438/51 |

* cited by examiner

*Primary Examiner*—Luan Thai
(74) *Attorney, Agent, or Firm*—Laleh Jalali

(57) ABSTRACT

A method and an arrangement to bond a die to a substrate of a die-substrate combination to form a microelectronic package. The method comprises: providing the die-substrate combination including a die, a substrate, pre-connection bumps and an underfill material, the pre-connection bumps and underfill material being disposed between the die and the substrate; forming joints from the pre-connection bumps at a joint formation site to obtain an intermediate package; curing the underfill material of the intermediate package at an underfill curing site to obtain the microelectronic package; using a conveying device to transfer the intermediate package from the joint formation site to the underfill curing site; and applying heat energy to the intermediate package during at least part of a transfer thereof from the joint formation site to the underfill curing site to control a temperature of the intermediate package.

30 Claims, 5 Drawing Sheets

METHOD OF BONDING A MICROELECTRONIC DIE TO A SUBSTRATE AND ARRANGEMENT TO CARRY OUT METHOD

FIELD

Embodiments of the present invention relate to a method of bonding a die to a substrate and an arrangement for carrying out the method.

BACKGROUND

In the process of bonding die, such as flip chips, to a microelectronic substrate to form a microelectronic package, the use of thermal compression bonding followed by post-curing is known. Flip chips are surface-mounted chips having connecting metal lines attached to pads or bumps on the underside of the chips. A chip or die is typically mounted on an IC substrate to form an IC assembly. For example, a die may be mounted on a package substrate and the resulting package mounted on a printed circuit board ("PCB"). A die may also be directly mounted to a PCB. Underfill is provided between the die and the IC substrate to support the electrical connections, to protect them from the environment, and to reduce the thermomechanical stresses on the die connection. Such thermomechanical stresses are typically caused by the high temperatures necessary to reflow bumps on the die and/or on the substrate together to form the electrical connections, or joints. During cooling, different shrinkage amounts of the die and substrate could lead to cracks within the die, especially when the die uses a mechanically weak interlayer dielectric (ILD). Such stresses could lead to increased under-bump ILD cracking. As a result of formation of the joints, the underfill material is partially cured, and can withstand some of the stresses mentioned above. After joint formation, the partially cured underfill is again typically cured at elevated temperatures in a cure oven. The cured underfill is adapted to at least partially compensate for stresses caused in the package by differing coefficients of thermal expansion (CTE's) of the die on the one hand and of the substrate on the other hand. However, after joint formation but before further curing of the partially cured underfill material, differing shrinkage rates of the die and the substrate could still cause damage to the device during a transfer of the bonded die and substrate to the cure oven.

A conventional method of mitigating the above problem is to reduce a transfer time of the bonded die and substrate from the formation site of the joints to the curing site of the underfill material, such as, for example, by minimizing a transfer distance of the same. However, the above method disadvantageously fails to fully address the following: the carrier acting as a heat sink and thus cooling the substrate very quickly after joint formation; the possibility of newly developed underfill materials or newly developed, more delicate ILD materials that may not perform adequately as the conventional levels of temperature control; a reliance on ambient temperature and humidity conditions that may not be suitable for all factory environments.

A method of bonding a die to a substrate and an arrangement for carrying out the method are needed that address the disadvantages of the prior art.

BRIEF DESCRIPTION OF THE DRAWINGS

Embodiments of the present invention are illustrated by way of example and not by way of limitation in the figures of the accompanying drawings, in which the like references indicate similar elements and in which.

DETAILED DESCRIPTION

A method of bonding a die to a substrate and an arrangement for carrying out the method are disclosed.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention; however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

Figure 1A:
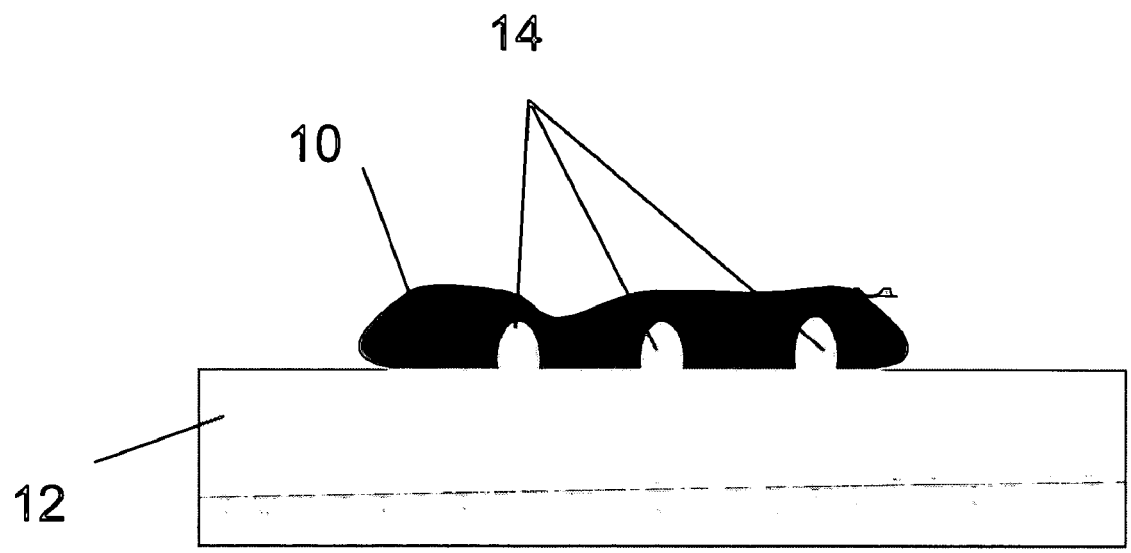
FIGS. 1a-1e are schematic, cross-sectional representations of stages of formation of a package from a die and a substrate.

FIGS. 1a-1e depict well known stages in the formation of a package from a die and a substrate. Typically, as seen in FIG. 1a, an uncured underfill material 10, such as a noflow underfill material, may be dispensed onto a substrate 12 including pre-connection bumps 14. "Pre-connection bumps" as used herein refer to bumps that, when reflowed and solidified through conventional techniques, such as compression and heat treatment, form joints between die and substrate that are electrically conductive and that further mechanically bond the die to the substrate. Pre-connection bumps 14 may comprise pre-solder bumps. The pre-connection bumps typically connect electrical contacts (not shown) on the substrate to electrical contacts, such as contacts 16 (see FIG. 1b), on the die.

Figure 1B:
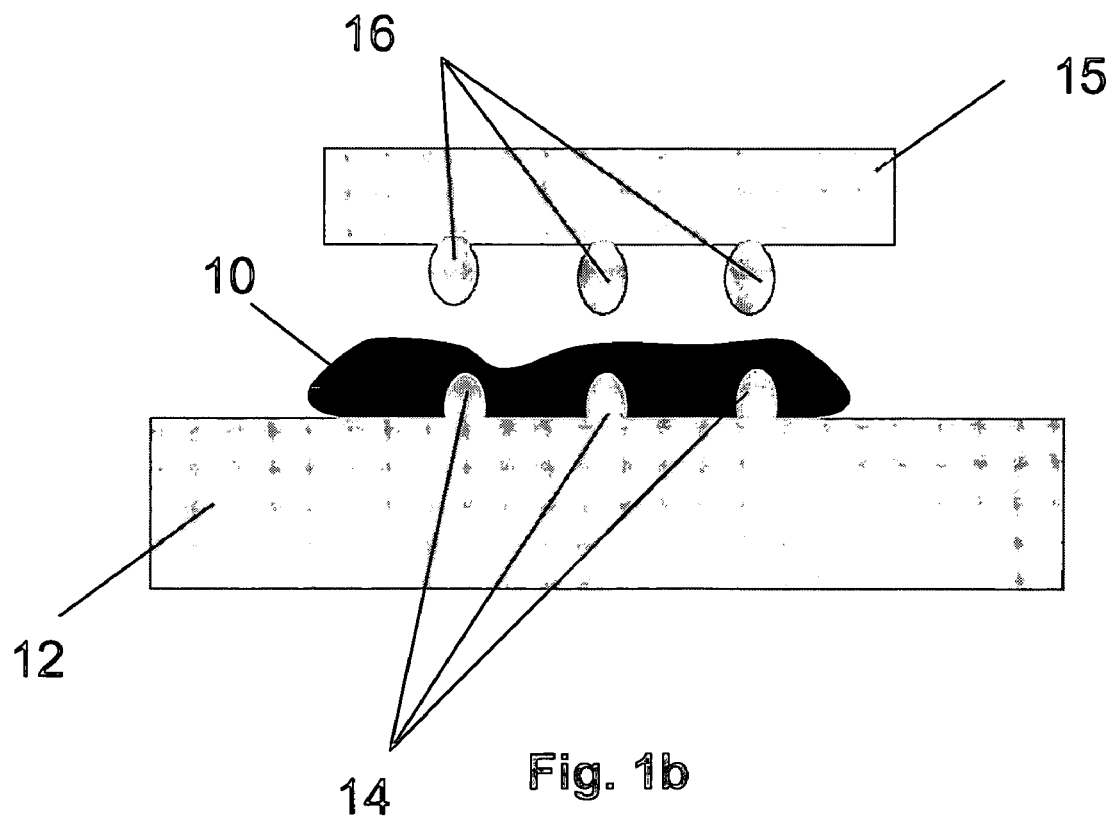
Figure 1C:
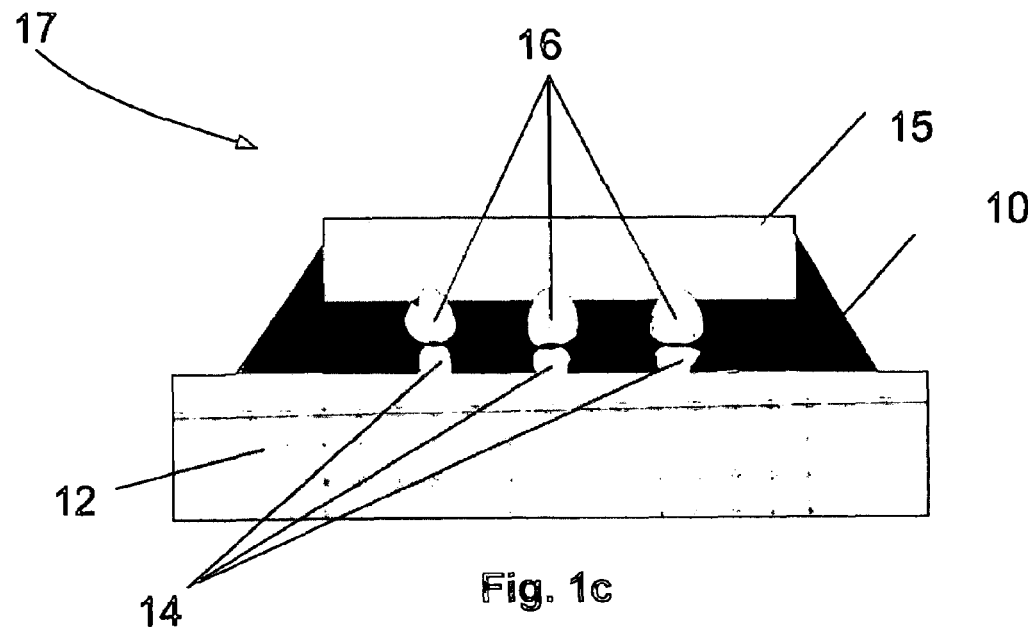

After the underfill material 10 is dispensed, as shown in FIGS. 1b and 1c, a die 15 having electrical contacts 16 at an underside thereof may be joined to the substrate by placing pre-connection bumps 14 in registration with electrical contacts 16, and by exposing the thus formed die-substrate combination to a compression force and elevated temperature, for example in a thermal compression bonder (TCB). FIG. 1c shows a conventional die-substrate combination (DSC) 17 prior to joint formation.

Figure 1D:
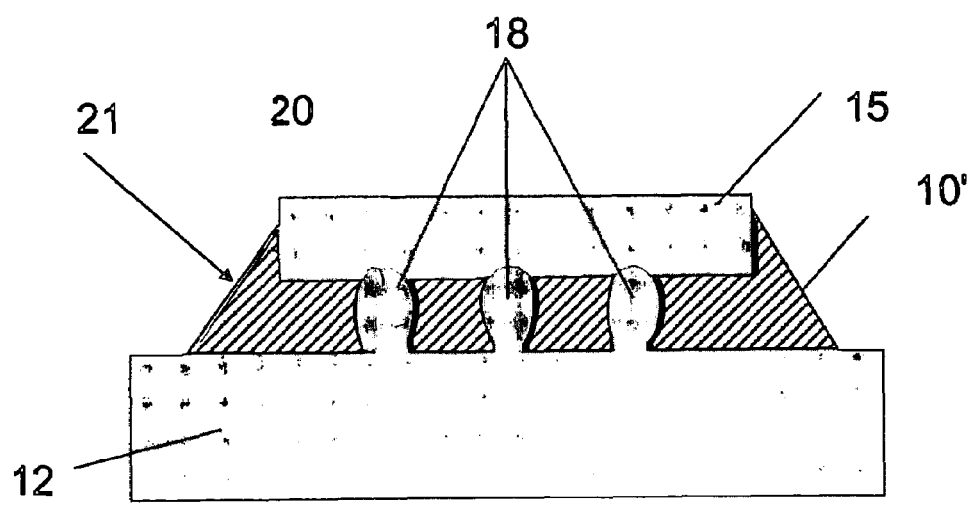

As seen in FIG. 1d, after exposing the DSC to a compression force and elevated temperature, joints, such as joints 18, may be formed between the die and the substrate.

By "joint," what is meant in the context of the instant description is a connection between the die and the substrate that is both electrically conductive and that further mechanically bonds the die to the substrate. Joint formation may additionally result in a partial curing of the underfill material into partially cured underfill material 10', which may be adapted to withstand some of the thermomechanical stresses mentioned above. After formation of the joints and before the underfill material is completely cured, the resulting structure will be referred to herein as an intermediate package, such as, for example, intermediate package 21 of FIG. 1d.

Figure 1E:
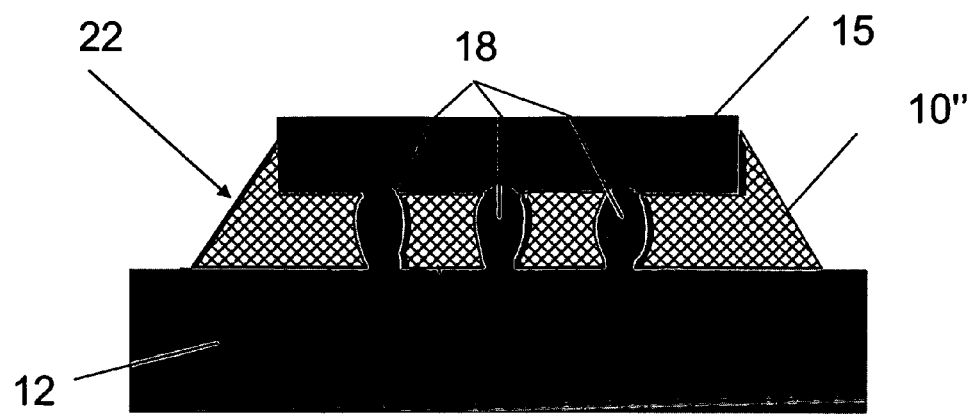

As seen in FIG. 1e, after formation of the joints, the underfill material is typically post-cured under elevated temperatures. The above allows the partially cured underfill material 10' to cure and solidify into cured underfill material 10" to form a package 22 as shown.

The intermediate package, such as intermediate package 21 of FIG. 1d, is typically transferred from a joint formation site, or bond station, such as a thermal compression bonder, to an underfill curing site, such as a cure oven, to cure the partially cured underfill material to resulting a package as described above. By "joint formation site," what is meant in the context of the instant description is a site at which joints may be formed between the die and the substrate. By "underfill curing site," what is meant in the context of the instant description is a site at which underfill material may be cured. During the above transfer operation, the intermediate package tends to cool, and, consequently, because the underfill material is as yet only partially cured or uncured, differing rates of shrinkage of the die and of the substrate can affect the intermediate package by placing thermomechanical stresses on the joints. As explained above, such stresses can disadvantageously lead to ILD cracking and possible device failure. ILD cracking and/or device failure tend to occur when a temperature of the intermediate package drops below a critical temperature. As used herein, what is meant by "critical temperature" is a temperature below which an intermediate package, such as intermediate package 21 of FIG. 1d, would undergo ILD cracking. In the context of current generation underfill materials and ILD's, the critical temperature may be about 180 degrees Celsius. The critical temperature is among other things a function of the cure chemistry of the underfill material. As new underfill materials and new ILD's are developed, the critical temperature may be appreciably higher than the stated 180 degrees Celsius.

Embodiments advantageously mitigate the above problem by applying heat energy to the intermediate package to control a temperature of the intermediate package during at least part of its transfer to the cure oven, as will be described in further detail below. According to an embodiment, heat energy may, for example, be supplied by a traveling heater. See FIGS. 3a-3d. By "traveling heater," what is meant in the context of the instant invention is a heater that is adapted to move to apply heat energy to the intermediate package during its transfer from the joint formation site to the underfill curing site. Embodiments of the present invention encompass any arrangement of applying heat energy to the intermediate package to control a temperature of the same during at least part of its transfer to the cure oven. For example, according to an embodiment, heat energy may, for example, be applied to the intermediate package by a heated tunnel encompassing the intermediate package during at least part of its transfer to the cure oven. See FIG. 5. The embodiments of FIGS. 3a-3d and FIG. 5 will be described in further detail below. In addition, another embodiment may encompass applying heat energy to the intermediate package by heating a conveying device conveying the intermediate package between the joint formation site and the underfill curing site, or by heating the carrier carrying the DSCC's. Any combination of the above-described arrangements for applying heat energy to the intermediate package would be within the purview of embodiments of the present invention.

Figure 2:
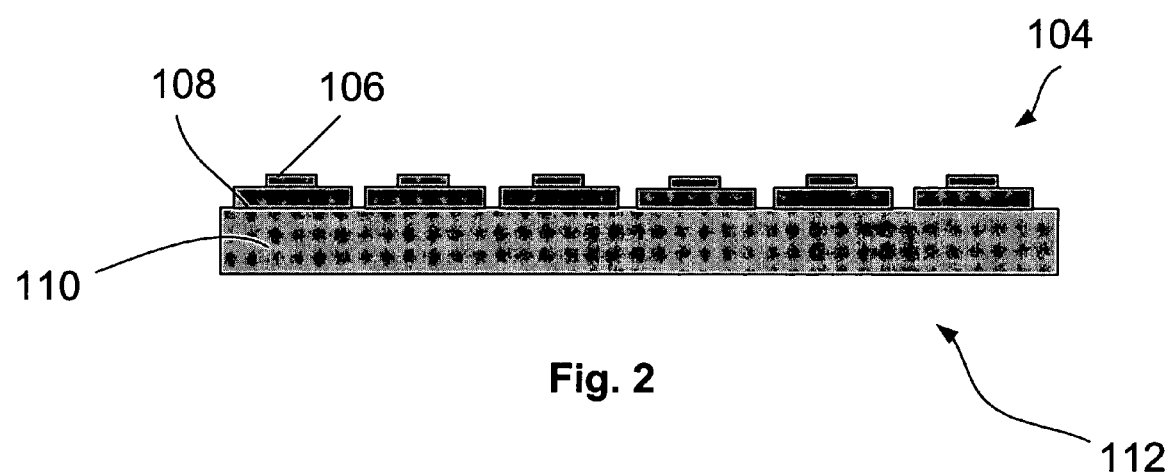
FIG. 2 is a schematic representation a conventional die-substrate combination cluster (DSCC) 112 to be subjected to a method of bonding according to embodiments.

FIG. 2 shows a conventional die-substrate combination cluster (DSCC) 112 to be processed. As shown in FIG. 2, DSCC 112 may include a plurality of individual DSC's 104, similar to DSC 17 of FIG. 1c. Each DSC of the DSCC 112 may be disposed on a conventional metal carrier 110 as would be recognized by one skilled in the art. Each DSC 104 includes a die 106, a substrate 108, underfill material 109, the die being disposed on the substrate and the underfill material being disposed between the die and the substrate. The underfill material may include a noflow underfill material, which may, for example, include any of the conventional flux containing underfill materials as would be recognized by one skilled in the art, such as, for example, epoxy, urethane or isocynate as thermoset underfill materials, or high density polyethylene or polypropylene as thermoplastic underfill materials. Other underfill materials are within the scope of embodiments of the present invention. It is noted that the carrier defines openings therein in registration with each DSC 104 to allow pedestals of a TCB to lift the DSC's off of the carrier during thermal compression bonding, as will be explained in further detail in relation to FIG. 3b below. The combination shown in FIG. 2 is then a die-substrate combination cluster or DSCC 112 as shown.

FIGS. 3a-3d depict various stages of bonding a die to a substrate according to embodiments. As seen in FIGS. 3a-3d, an arrangement 100 to bond a die to a substrate according to embodiments may include a chip attach tool 102. The substrates of each DSC may be pre-loaded with underfill material and the carrier pre-loaded with the combination of the substrates and underfill material. The chip attach tool, such as chip attach tool 102, may then load each die on its corresponding substrate-underfill combination as appropriate. The arrangement, such as arrangement 100, may further include a conveying device, such as, for example, conveyor 114, a joint formation site 115, and a underfill curing site 117. The conveyor 114 is adapted to move each DSCC 112 from the chip attach tool 102 through the joint formation site 115 and into the underfill curing site 117 in a conventional manner. The joint formation site 115 may include a conventional TCB 116 as shown. TCB 116 may include heated support pedestal device 118 and a gang bonder 120 disposed opposed the pedestal device 118 to cooperate therewith during joint formation. The underfill curing site may include a cure oven 119. The conveying device may encompass any suitable configuration, and is not limited to a conveyor, as will be recognized by one skilled in the art. The arrangement further includes a traveling heater arrangement 128 according to an embodiment, as will be described in further detail below.

Figure 3A:
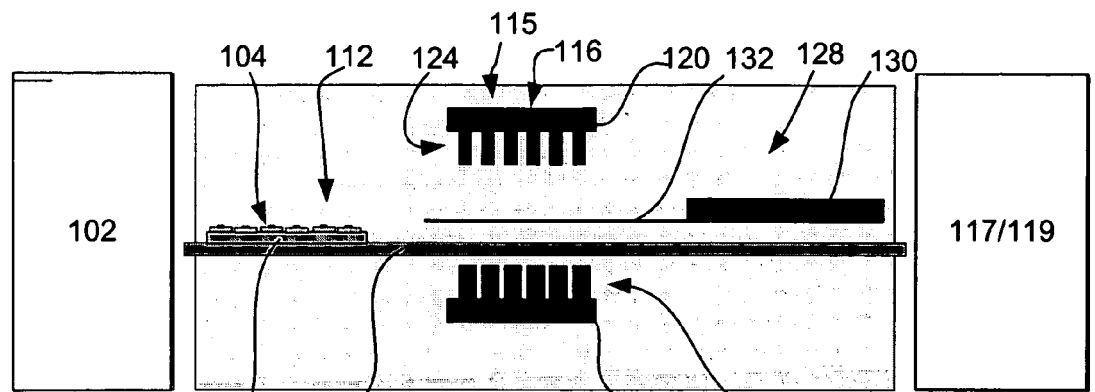
FIGS. 3a-3d are schematic representations of stages of a method of bonding according to an embodiment of the present invention using the DSCC of FIG. 2.

Referring to FIG. 3a, a method of bonding a die to a substrate according to an embodiment may include moving a DSC into a joint formation site. For example, according to an embodiment, conveyor 114 may transport DSCC 112 into TCB 116 as shown, such that openings (not shown) in the carrier 110 allow pedestals 122 of pedestal device 118 to lift the DSC's off of the carrier during thermal compression bonding. Devices other than conveyors to move the DSC into a joint formation site are within the scope of embodiments, as would be recognized by one skilled in the art.

Figure 3B:
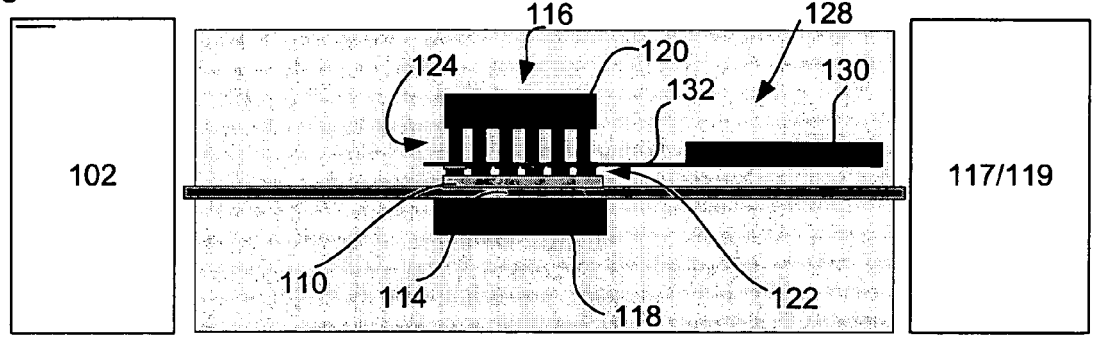

Referring next to FIG. 3b, a method of bonding a die to a substrate according to an embodiment may include forming joints between the die and the substrate at the joint formation site to yield an intermediate package. For example, as seen in FIG. 3b, once DSCC 112 is in joint formation site 115, the substrates 108 of each DSC 104 may be lifted off metal carrier 110 by the heated pedestals 122 of pedestal device 118 and pressed against gang bonding heads 124 of gang bonder 120. The application of heat and compression in TCB 116 results in a reflowing of pre-solder bumps on the substrate, thus forming joints between each die and substrate to bond each die to its corresponding substrate. For example, the DSC's 104 may be held in the TCB 116 at a temperature of about 255 degrees Celsius at a dwell time of about 7 minutes at a pressure of about 83 Newtons to reflow pre-solder bumps between each die and its corresponding substrate. The solder then solidifies substantially immediately after the temperature dips below the temperature of the TCB, as recognized by one skilled in the art. The thus formed intermediate package, may be similar to intermediate package 21 of FIG. 1d, and may, according to embodiments, include joints and either uncured or partially cured underfill material. After joint formation, an intermediate package cluster (IPC) 125 is formed from the DSCC 112 including intermediate packages 127.

Figure 3C:
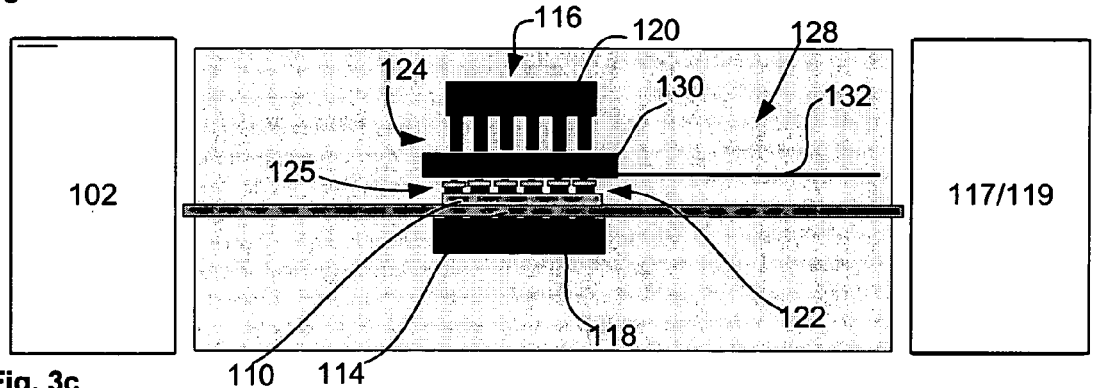
Figure 3D:
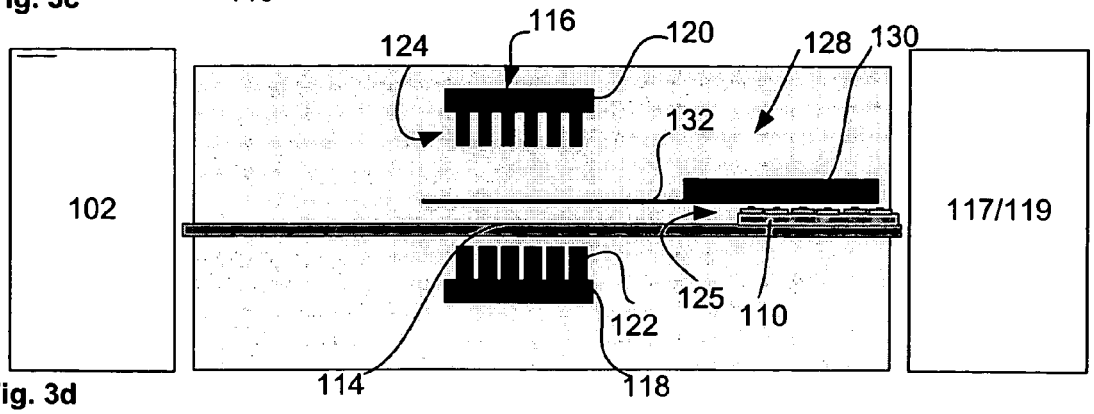

As next seen in FIG. 3c, a method of bonding a die to a substrate according to an embodiment may include using a traveling heater arrangement including a traveling heater to control a temperature of the intermediate package during a transfer thereof to an underfill curing site by applying heat energy thereto. According to embodiments, the traveling heater arrangement comprises a traveling heater and a traveling heater moving mechanism that is adapted to guide the heater along with the intermediate package being processed. In the shown embodiment, the traveling heater moving mechanism comprises the traveling heater track 132. For example, a traveling heater arrangement 128 including a traveling heater 130 and traveling heater track 132 may be disposed such that the traveling heater 130 is placed in a vicinity of the IPC 125 after joint formation to control a temperature of each intermediate package 127 during its transfer to the cure oven 119. According to a preferred embodiment, the traveling heater may be a non-contact heater, such as heater 130 shown in FIG. 3c, in that it does not contact the IPC being processed. By way of example, according to embodiments, the traveling heater may comprise an infrared heater, a convection heater, an inductive heater, a conduction heater, an ultraviolet heater or a ceramic heater, other types of heater being within the scope of embodiments as would be recognized by one skilled in the art.

The traveling heater 130 may control a temperature of the intermediate packages on the IPC to maintain such temperature in a range above a critical temperature of each intermediate package below which critical temperature ILD cracking would occur. Such critical temperature may be determined by performing a process characterization analysis based on the underfill and the ILD chosen for the DSC to be subjected to bonding. According to the process characterization analysis, for a given underfill-ILD combination, process parameters may be set for a given bonding process, and the formed microelectronic packages then subjected to testing, such as ultrasonic testing, to determine whether any ILD damage has occurred. Based on a dynamic bond-cycle profile of data obtained from the ultrasonic testing, process parameters may be reset for the bonding process until a critical temperature threshold is determined for the used underfill-ILD combination. For conventional noflow underfill materials, the critical temperature is typically about 180 degrees Celsius, and the traveling heater according to an embodiment may be set to control the temperature of the IPC's at about 180 degrees Celsius from the joint formation site to the cure oven.

Figure 4:
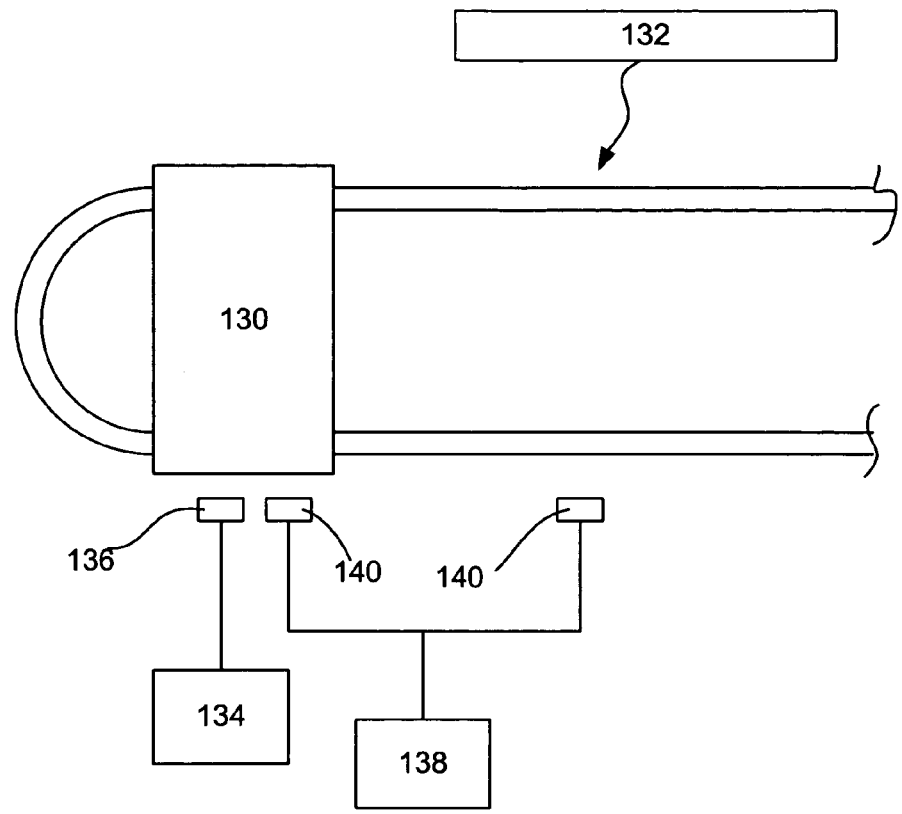
FIG. 4 is a schematic, top plan view of the traveling heating arrangement of FIGS. 3a-3b.

FIG. 4 depicts a top plan view of the arrangement of FIGS. 3a-3d. As best seen in FIG. 4, the traveling heater moving mechanism may further include a heater motion control system (HMCS), such as HMCS 138 coupled to heater 130 and/or the track 132, to control a motion of the heater such that a speed of the heater matches a speed of the intermediate package being processed and such that the heater is adjacent the intermediate package as it moves from the joint formation site to the underfill curing site. The HMCS may be a closed loop control system. Thus, HMCS 138 may, according to an embodiment, include a sensor 140 coupled to the traveling heater 130 and/or track 132 to sense a speed of the traveling heater and a position of the traveling heater with respect to the IPC being processed. HMCS 138 may be adapted to control the traveling heater track 132 based on speed and position feedback from the sensor 140 in order to maintain traveling heater 130 adjacent the intermediate package or packages being processed during its transfer from the joint formation site to the cure oven. By "adjacent IPC" what is meant in the context of the above invention is a location near the intermediate package or packages being processed such that heat energy from the heater is effective for controlling a temperature of the package or packages at least within a predetermined range. Preferably, as depicted in FIGS. 3a-3d, a traveling heater according to embodiments is positioned to deliver heat energy to the intermediate package being processed from a top region of the intermediate package, that is, from a die-side of the intermediate package. More preferably, a traveling heater according to embodiments moves into the TCB region just after retraction of the bonding heads 124 and just before retraction of the heated pedestals 122 to apply heat energy to the intermediate package. It is noted that heat is applied to the DSC's during joint formation in the TCB by both the bonding heads 124 and by the pedestals 122. When bonding heads 124 retract, the pedestals 122 still apply some heat to the formed intermediate packages. It would thus be preferable according to an embodiment to ensure that heat is continuously applied to the intermediate packages being processed by applying heat energy to the intermediate packages from a source other than the pedestals just before retraction of the same.

It is further noted that, the traveling heater according to embodiments may be used at any part of a transfer of an IPC from the joint formation site to the underfill curing site, such as for an entire distance of the transfer or for only part of such distance. For example, the traveling heater according to embodiments may be placed at the joint formation site from the time when gang bonding heads 124 retract while the pedestals 122 are still in an elevated position with the intermediate packages thereon, to a time just before the IPC is delivered by the conveyor 114 to the cure oven 119.

As seen in FIG. 4, preferably, the traveling heater arrangement may include a closed loop heating control system (CLHCS), such as arrangement 128 including CLHCS 134. The CLHCS may, according to an embodiment, include a sensor coupled to the traveling heater, such sensor 136 coupled to heater 130. The CLHCS may be adapted to control a heat energy of the traveling heater directed at the IPC's based on temperature feedback from the sensor in order to maintain such heat energy at a level to maintain a temperature of the intermediate package being processed in a predetermined temperature range at or above the critical temperature.

Figure 5:
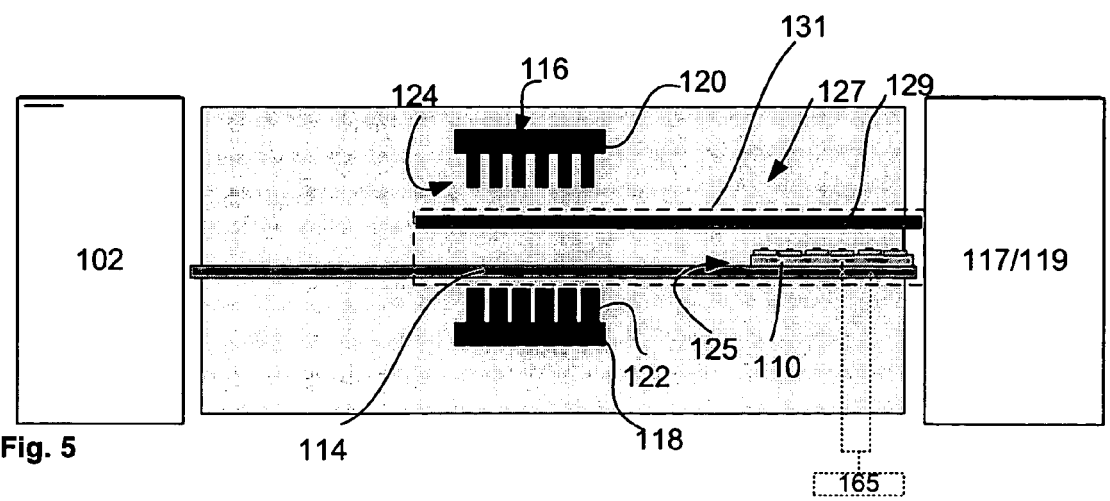
FIG. 5 is a schematic representation of a heating arrangement to apply heat energy to a die-substrate package during at least part of a transfer thereof to an underfill curing site.

Referring next to FIG. 5, embodiments of the present invention encompass a heating arrangement 129 to applying heat energy to the intermediate package during at least part of a transfer thereof to the underfill curing site. Arrangement 129 may include at least a tunnel heater, as shown by tunnel 131 depicted in broken lines including a heater 129 therein. Arrangement 129 may further include, additionally or in the alternative, a heater 165 adapted to apply heat energy to the intermediate package during said at least part of a transfer thereof through the carrier, such as through carrier 110, and/or through the conveying device, such as through conveyor 114, or both.

Embodiments of the present invention advantageously provide an arrangement for effectively controlling a temperature of an intermediate package at any time period during its transfer from the joint formation site to the underfill curing site, thus significantly reducing ILD cracking and possible device failure typically associated with rapid cooling of the intermediate package below its critical temperature. Advantageously, embodiments address the issue of the carrier acting as a heat sink to cool the substrate very quickly after joint formation by allowing the temperature of each intermediate package to be controlled in a reliable manner. Additionally, embodiments advantageously leave room for the possibility of newly developed underfill materials or newly developed, more delicate ILD materials that may not perform adequately at the conventional levels of temperature control. Moreover, embodiments advantageously dispense with a reliance on ambient temperature and humidity conditions that may not be suitable for all factory environments.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method of bonding a die to a substrate of a die-substrate combination to form a microelectronic package comprising:
    providing the die-substrate combination including a die, a substrate, pre-connection bumps and an underfill material, the pre-connection bumps and underfill material being disposed between the die and the substrate;
    forming joints from the pre-connection bumps at a joint formation site to obtain an intermediate package;
    curing the underfill material of the intermediate package at an underfill curing site to obtain the microelectronic package;
    using a conveying device to transfer the intermediate package from the joint formation site to the underfill curing site; and
    applying heat energy to the intermediate package during at least part of a transfer thereof from the joint formation site to the underfill curing site to control a temperature of the intermediate package.

2. The method of claim 1, wherein applying heat energy comprises using a traveling heater arrangement including:
    a traveling heater; and
    a traveling heater moving mechanism coupled to the traveling heater and adapted to guide the traveling heater adjacent the intermediate package during said at least part of a transfer thereof.

3. The method of claim 2, wherein the traveling heater moving mechanism comprises a traveling heater track.

4. The method of claim 2, wherein applying heat energy comprises using a heater motion control system operatively coupled to the heater to control a motion of the heater adjacent the intermediate package during said at least part of a transfer thereof.

5. The method of claim 4, wherein applying heat energy comprises using a sensor coupled to the traveling heater to sense a speed and a position of the traveling heater during said at least part of a transfer of the intermediate package, the motion control system further being adapted to control the motion of the heater as a function of feedback from the sensor.

6. The method of claim 1, wherein applying heat energy comprises applying heat energy to control the temperature of the intermediate package in a range above a critical temperature thereof.

7. The method of claim 6, wherein the critical temperature is about 180 degrees Celsius.

8. The method of claim 2, wherein applying heat energy comprises using a heating control system coupled to the heater to control a heat energy of the traveling heater directed at the intermediate package.

9. The method of claim 8, wherein applying heat energy comprises using a sensor coupled to the heater to sense a heat energy thereof directed at the intermediate package, the heating control system further being adapted to control the heat energy of the traveling heater as a function of feedback from the sensor.

10. The method of claim 2, wherein the traveling heater comprises at least one of an infrared heater, a convection heater, an inductive heater, a conduction heater, an ultraviolet heater and a ceramic heater.

11. The method of claim 1, wherein the joint formation site includes a thermal compression bonder.

12. The method of claim 1, wherein the underfill curing site includes a cure oven.

13. The method of claim 1, further comprising bonding a plurality of die to a plurality of substrates of corresponding die-substrate combinations to form respective microelectronic packages therefrom, wherein:
    forming joints comprises forming joints to obtain a plurality of intermediate packages from each of the corresponding die-substrate combinations;
    curing comprises curing underfill material from each of the plurality of intermediate packages to obtain respective microelectronic packages therefrom;
    using a conveying device comprises transferring the plurality of intermediate packages from the joint formation site to the underfill curing site on a carrier; and
    applying heat energy comprises applying heat energy to the plurality of intermediate packages during at least part of a transfer thereof from the joint formation site to the underfill curing site.

14. The method of claim 1, wherein the pre-connection bumps comprise pre-solder bumps.

15. The method of claim 2, wherein the traveling heater moving mechanism is adapted to guide the traveling heater at least one of above, to a side and below the intermediate package during said at least part of a transfer thereof.

16. The method of claim 1, wherein said at least part of a transfer of the intermediate package comprises an entire transfer of the intermediate package.

17. The method of claim 1, wherein applying heat energy comprises using a heated tunnel encompassing at least part of the conveying device to control a temperature of the intermediate package during said at least part of a transfer thereof.

18. The method of claim 1, wherein applying heat energy comprises using a heater to heat the conveying device to control a temperature of the intermediate package during said at least part of a transfer thereof.

19. The method of claim 13, wherein applying heat energy comprises using a heater to heat the carrier to control a temperature of the plurality of intermediate packages during said at least part of a transfer thereof.

20. An arrangement to bond a die to a substrate of a die-substrate combination to form a microelectronic package, the die-substrate combination including a die, a substrate, pre-connection bumps and an underfill material, the bumps and the underfill material being disposed between the die and the substrate, the arrangement comprising:
   a joint formation site comprising a device to form joints between the die and the substrate from the pre-connection bumps to yield an intermediate package;
   an underfill curing site comprising a device to cure the underfill material of the intermediate package to yield the microelectronic package;
   a conveying device disposed to transfer the intermediate package from the joint formation site to the underfill curing site; and
   a device to apply heat energy to the intermediate package during at least part of a transfer thereof from the joint formation site to the underfill curing site to control a temperature of the intermediate package.

21. The arrangement of claim 20, wherein the joint formation site comprises a thermal compression bonder.

22. The arrangement of claim 20, wherein the underfill curing site comprises a cure oven.

23. The arrangement of claim 20, wherein the conveying device comprises a conveyor.

24. The arrangement of claim 20, wherein a device to apply heat energy comprises a traveling heater arrangement including:
   a traveling heater; and
   a traveling heater moving mechanism coupled to the traveling heater and adapted to guide the traveling heater adjacent the intermediate package during said at least part of a transfer thereof.

25. The arrangement of claim 24, wherein the traveling heater moving mechanism comprises a traveling heater track.

26. The arrangement of claim 24, wherein the traveling heater moving mechanism comprises a heater motion control system operatively coupled to the heater to control a motion of the heater adjacent the intermediate package during said at least part of a transfer thereof.

27. The arrangement of claim 26, wherein the heater motion control system comprises a sensor coupled to the traveling heater to sense a speed and a position of the traveling heater during said at least part of a transfer of the intermediate package, the motion control system further being adapted to control the motion of the heater as a function of feedback from the sensor.

28. The arrangement of claim 24, wherein the traveling heater arrangement further comprises a heating control system coupled to the heater to control a heat energy of the traveling heater directed at the intermediate package.

29. The arrangement of claim 27, wherein the heating control system comprises a sensor coupled to the heater to sense a heat energy thereof directed at the intermediate package, the heating control system further being adapted to control the heat energy of the traveling heater as a function of feedback from the sensor.

30. The arrangement of claim 20, wherein the device to apply heat energy comprises at least one of a heated tunnel encompassing at least part of the conveying device and a heater to heat the conveying device to control a temperature of the intermediate package during said at least part of a transfer thereof.

* * * * *